Jan. 10, 1961 J. R. PATMORE 2,968,005
STABILIZED DIRECT COUPLED TRANSISTOR AMPLIFIER
Filed Feb. 8, 1960
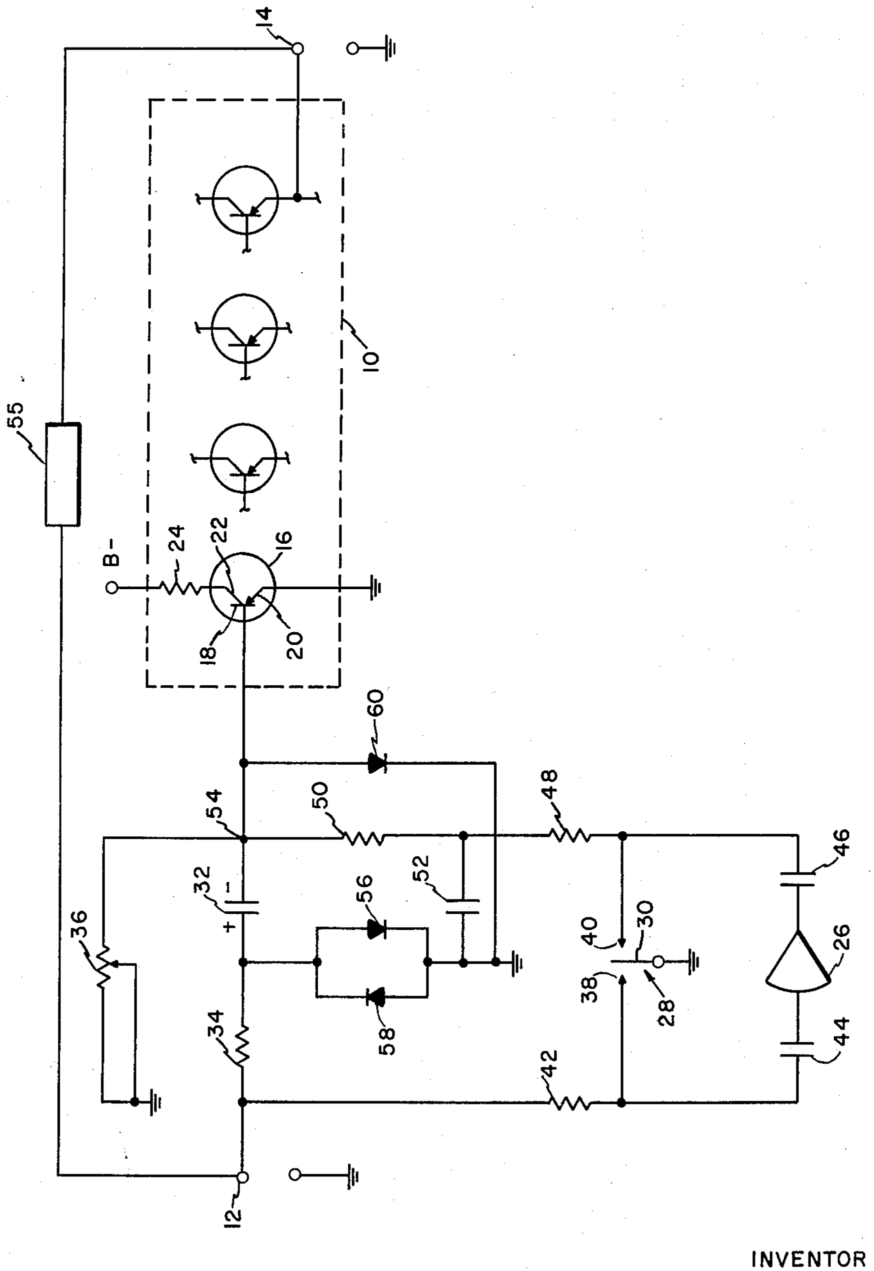
INVENTOR
JAMES R. PATMORE
BY E. A. Petko
ATTORNEY

United States Patent Office 2,968,005

Patented Jan. 10, 1961

2,968,005

STABILIZED DIRECT COUPLED TRANSISTOR AMPLIFIER

James R. Patmore, Neptune, N.J., assignor to Electronic Associates Inc., Long Branch, N.J., a corporation of New Jersey Filed Feb. 8, 1960, Ser. No. 7,229

6 Claims. (Cl. 330—9)

This invention relates generally to direct coupled transistor amplifiers in combination with automatic balancing circuits and more particularly to the automatic stabilization of such combinat.ons.

The amplifiers used in electronic computers must be capable of functioning as summing devices, differentiators and integrators dependent upon the characteristics of the components in their input and over-all feedback circuits. The so-called automatic balancing circuit, comprising a modulated carrier-type amplifier, in combination with a direct coupled or D.-C. amplifier has been found to be particularly useful in performing such functions because the combination of these two amplifiers affords the freedom from drift of the modulated carrier-type amplifier, the superior high frequency response of the direct coupled amplifier and exceptionally high over-all gains.

It is known that the operation of a direct coupled amplifier utilizing an automatic balancing circuit may be considerably improved by elimination from the summing juncture of all extraneous currents such as may be attributable to the grid or base currents of an input stage. These grid or base currents may be eliminated through the use of a blocking capacitor and separate return resistor as is well known.

It is also well known that the higher range of the frequency band pass of the modulated carrier-type amplifier should be selected to overlap slightly the lower range of the frequency band pass of the D.-C. amplifier in order to obtain accurate reproduction of the input potentials being applied to these combined amplifiers. The value of capacitance of the blocking capacitor as well as the input impedance of the input circuit to the D.-C. amplifiers each in part determine the frequency band pass characteristics of the D.-C. amplifier. As long as the input stage of the D.-C. amplifier utilizes a vacuum tube the selection of appropriate blocking capacitors has not been problematic; however, when a transistor is utilized in the input stage, not only is the need for a base current blocking capacitor more pronounced, its use and selection immediately creates an additional difficulty, the input impedance of the usual transistor being such that the capacitance and physical size of the blocking capacitors approach impractical proportions.

In order to obtain a useful base current blocking circuit of practical proportions, it has become customary in at least one prior art D.-C. transistor amplifier to utilize a polarized blocking capacitor. Although this expedient has been somewhat satisfactory in permitting the use of capacitors of practical proportions, it has been found that the automatic balancing circuit tends to become saturated under certain operating conditions, leading to generally unstable and unreliable amplifier operation. Saturation of the automatic balancing circuit has been found to be most pronounced when the input signal to the amplifier represents an overload condition.

The present invention contemplates the use of a base current blocking circuit which overcomes the undesirable effects occasioned by saturation of the automatic balancing circuit used in conjunction with D.-C. transistor amplifiers. According to this invention the input circuit to the base of an input stage of a D.-C. amplifier includes a polarized capacitance element and an asymmetrical conducting element. The asymmetrical conducting element limits the amplitude of potential of one polarity applied across the capacitive element to a value such as not to saturate the automaic balancing circuit under signal input overload conditions. Accordingly, an object of the present invention is to improve the operation and stability of a combined D.-C. transistor amplifier and automatic balancing circuit.

Another object of the present invention is to prevent during overload conditions the saturation of an automatic balancing circuit used in conjunction with a D.-C. amplifier.

It is another object of the present invention to utilize polarized capacitor means and asymmetrical conducting means to influence the extraneous currents which appear at the summing juncture of a direct coupled transistor amplifier and automatic balancing circuit combination.

These and other objects, features and advantages will be set forth with greater particularity in the following description of the preferred embodiment of this invention. In the description reference is made to the single figure of the accompanying drawing which is a schematic representation of a direct coupled transistor amplifier having an automatic balancing circuit.

Referring now to the drawing, there is shown within the rectangle 10 a direct coupled amplifier having an input terminal 12 and an output terminal 14. The direct coupled amplifier 10 comprises a transistor input stage 16 having a base 18, an emitter 20 and a collector 22. Emitter 20 is shown connected to ground while collector 22 is shown connected to a suitable source of operating potential through a resistor 24. At 26 there is shown a conventional capacitance coupled A.C. amplifier. Operating in conjunction with the amplifier 26 is a synchronous vibrator-rectifier 28 having an armature 30 and a field coil, not shown, which is supplied with an alternating current potential of suitable frequency, e.g., 100 cycles per second.

The input circuit to the base of the input stage 16 includes a base current blocking capacitor 32 and a resistor 34 connected in series circuit arrangement between the input terminal 12 and the base 18. A base current return resistor may take the form of an amplifier balance potentiometer 36 which is connected between the base 18 and ground.

The vibrator-rectifier 28 is provided with a set of contacts 38, 40 cooperating with the armature 30 to convert a direct current signal potential taken from the input terminal 12 through a resistor 42 into a pulsating direct current potential having an amplitude proportional to the direct current signal. This pulsating potential is impressed through coupling capacitor 44 to the control electrode, not shown, of the first stage of the amplifier 26 and appears, after amplification in the amplifiers 26, as a modulated output signal at the coupling capacitor 46.

The capacitor 46 connects the output of amplifier 26 to the contact 40. Inasmuch as the armature 30 operates contact 40 with respect to ground at 180° out of phase with respect to contact 38, the amplifier output signal at capacitor 46 is reconverted to a direct current potential, viz., it is demodulated. This demodulated signal is then applied to the terminal 54 after being filtered in a conventional low pass filter comprising the resistors 48, 50 and the capacitor 52.

The amplified and rectified signal applied to the terminal 54 serves as a correction voltage or balancing signal for the D.-C. amplifier. This correction voltage is of the same polarity as the direct current signal potential, and it is introduced at the control electrode of the D.-C. amplifier in such a manner with respect to amplifier gain controlled by that electrode as to compensate for the effects of drift due to variations in circuit components caused by aging, temperature change, etc., to a high degree, and, therefore, is of great value in electronic computers. In this embodiment the balancing signal is impressed on the base 18 through terminal 54 to control the collector current of the transistor input stage 16.

It is well known that whenever the absolute value of the input voltage to an amplifier, such as has been described, exceeds a permissible amplitude, the amplifier will become saturated and can no longer function as a linear device. In this condition, the amplifier output signal as fed back through feedback circuit 55 will be deficient to reduce the so-called error voltage at the amplifier input terminals and it will increase greatly. The error voltage, in accordance with the customary usage in the art, is a voltage differential at the input terminal of the amplifier which is due to inequality of the feedback voltage and the applied signal voltage. When saturated, an amplifier or feedback circuit will operate nonlinearly, usually because of overloading.

When a blocking capacitor is utilized in the amplifier input circuit it will become charged during these overload conditions. Then, even though the amplifier is momentarily inactivated in the usual manner of operation, the blocking capacitor will require some time to discharge to a level which will again permit the amplifier to operate as a linear device. A pair of diodes 56, 58, oppositely connected through the balance potentiometer 36 in a conductive circuit which shunts the blocking capacitor 32, are utilized to limit the charge which may appear upon the blocking capacitor. Diodes 56, 58 are preferably of the silicon junction or other similar type which represents an extremely high impedance when the voltage across them is zero or very small, and which have a characteristic impedance which drops rapidly to a low value as the applied voltage is increased.

By suitable adjustment of circuit constants, the range of base bias for linear operation of the transistor 16 may be made to correspond with the range of operation of the diodes. These diodes, therefore, effectively limit the charge on the blocking capacitor 32 to a value within the operating range of the transistor input stage 16. Then, when overload conditions occur and the amplifier becomes saturated, the capacitor does not develop a voltage of great enough value to exceed the linear range of the transistor. Consequently, almost immediately upon release of overload conditions, the amplifier completely recovers.

In the preferred embodiment of this invention the base current blocking capacitor 32 takes the form of a polarized capacitor, the opposite plates of which are polarized or biased in the manner indicated in the accompanying figure. Capacitors of this type are readily available commercially in the capacitance ratings required to insure appropriate matching of the frequency band pass characteristics of the D.-C. amplifier and the A.C. amplifier. The customary leakage current characteristic of this type of capacitor is such that the internal resistance to direct or leakage current is extremely high in the polarized or forward direction and extremely low above the breakdown potential, which corresponds to a pre-determined minimum amplitude of potential in the non-polarized or reverse direction. So long as the potentials applied across the capacitor in the reverse or non-polarized direction do not exceed the permissive breakdown potential, as determined by the leakage characteristic of the particular capacitor, the leakage resistance remains extremely high and the capacitor effectively blocks direct current leakage in the non-polarized or reverse direction. When the non-polarized or reverse potentials exceed the breakdown potential, the leakage currents are passed by the capacitor and it behaves very much like a diode or other asymmetric conducting device, rather than a capacitor.

Under overload conditions, when the error voltage at the amplifier input terminal is of a polarity which corresponds to the non-polarized or reverse polarity of the capacitor, it becomes apparent that a current corresponding to this potential will pass through the capacitor 32 and contribute to the error voltage appearing at terminal 12. Since the potential contributed to the error voltage by this leakage current is of the same polarity as the initial error voltage, the error voltage at terminal 12 continues to increase rapidly until the amplifier 26 becomes saturated. It should be apparent that the D.-C. amplifier 10 is already saturated in this condition and that the output signal is fed back through feedback circuit 55 is deficient to reduce the so-called error voltage.

Once amplifier 26 has become saturated, inactivation of the amplifier, as by mere removal of the overload condition, does not alleviate its saturated condition. This is brought about by the fact that, once capacitor 32 is caused to pass a leakage current, the amplitude of potential of the reverse or non-polarized polarity may be considerably less than the breakdown potential and still maintain a flow of leakage current to maintain amplifier 26 in a saturated condition. Accordingly, in prior art amplifiers it has been necessary to reverse the polarity of the error voltage at the input terminal 12 before the amplifier 26 would be restored to normal operation.

In order to remedy the undesirable and non-linear operation of the amplifier 26 there is now provided means to automatically and effectively limit the amplitude of potential of the non-polarized or reverse polarity which may appear at the terminal 54. This means takes the form of a diode 60 connected between ground and the base 18 of transistor input stage 16, and selected to conduct in response to a predetermined amplitude of potential having a polarity corresponding to the reverse or non-polarized potential. By suitable adjustment of circuit parameters, diode 60 is selected to conduct at an amplitude of potential which is slightly less than the breakdown potential of capacitor 32. The use of this diode, therefore, effectively prevents the leakage of direct currents of the non-polarized or reverse polarity and the saturating of amplifier 26. Consequently, its use in the coupling circuit of D.-C. amplifiers materially improves the stability and operation of D.-C. amplifier and automatic balancing circuit combinations.

While only one embodiment of this invention has been shown and described herein and inasmuch as this invention is subject to many variations, modifications and reversals of parts, it is intended that all matter contained in the above description shall be interpreted as illustrative and not in a limiting sense.

I claim:

1. In an automatic stabilizing circuit, the combination comprising a direct-coupled amplifier channel including a transistor having a base, an emitter and a collector, a base current blocking capacitor coupling said base to a source of signal potential, a modulated carrier-type amplifier channel connected in shunt circuit across said blocking capacitor, and means coupled to said base and to a point of fixed potential for limiting to a predetermined amplitude the potential of one polarity which is impressed across said capacitor by said modulated carrier-type amplifier channel.

2. In an automatic stabilizing circuit, the combination comprising a direct-coupled amplifier channel including a transistor having a base, an emitter and a collector, a base current blocking capacitor coupling said base to a source of signal potential, a modulated carrier-type amplifier channel coupling the source of signal to said base, a pair of oppositely connected unidirectional conducting devices connected in shunt to said blocking capacitor to limit the charge which may appear thereon, and means coupled to said base and to a point of fixed potential for limiting to a predetermined amplitude the potential of one polarity which is impressed thereon by said modulated carrier-type amplifier channel.

3. In an automatic stabilizing circuit, the combination comprising a direct-coupled amplifier channel including a transistor having a base, an emitter and a collector, a base current blocking capacitor coupling said base to a source of signal potential, a modulated carrier-type amplifier channel coupled to the source of signal potential and adapted for deriving corrective output signals of the same polarity as the signal potential, a filter for high frequnecy components connecting the output from said modulated carrier-type amplifier channel to said base, and means coupled to said base and to a point of fixed potential for limiting to a predetermined amplitude the potential of one polarity which is impressed upon said base by said modulated carrier-type amplifier channel.

4. The combination of a D.-C. amplifier having an output circuit, an input stage including a transistor having a base, an emitter and a collector, coupling means to connect said collector to said output circuit, a source of signal potential variable in polarity and in amplitude, a base current blocking capacitor having one plate connected to said source of signal potential and another plate connected to said base, a feedback connection between said output circuit and said one capacitor plate, a modulated carrier type amplifier channel connected in shunt circuit across said blocking capacitor, and assymetrical conducting means coupled to said base and to a point of fixed potential for limiting to a predetrmined amplitude the potential of one polarity which is impressed upon said base.

5. The combination of a D.-C. amplifier having an output circuit, an input stage including a transistor having a base, an emitter and a collector, coupling means to connect said collector to said output circuit, a source of signal potential variable in polarity and in amplitude, a base current blocking capacitor having one plate connected to said source of signal potential and another plate connected to said base, said capacitor being polarized to block large values of direct current in its forward direction and small values of direct current in its reverse direction, a feedback connection between said output circuit and said one capacitor plate, a modulated carrier type amplifier channel connected in shunt circuit across said blocking capacitor, and assymetrical conducting means coupled to said base and to a point of fixed potential for effectively blocking the flow of direct currents through said capacitor in the reverse direction.

6. The combination of a D.-C. amplifier having an output circuit, an input stage including a transistor having a base, an emitter and a collector, means coupling said collector to said output circuit, a source of signal potential variable in polarity and in amplitude, a base current blocking capacitor having one plate connected to said source of signal potential and another plate connected to said base, said capacitor being polarized to block large values of direct current of one polarity and small values of direct current of another polarity, a feedback connection between said output circuit and said one capacitor plate, a modulated carrier type amplifier channel connected to said source of signal potential and adapted to derive corrective output signals of the same polarity as said signal potential, a filter for high frequency components connecting the output from said amplifier channel to said base, and unidirectional conducting means coupled to said base and to a point of fixed potential for limiting the amplitude of potential of one polarity applied to said base by said amplifier channel to thereby effectively block the direct currents of said other polarity from being passed by said capacitor.

References Cited in the file of this patent

UNITED STATES PATENTS 2,856,468 Berry ---------------- Oct. 14, 1958